United States Patent
Ilani

(10) Patent No.: US 10,572,189 B2
(45) Date of Patent: Feb. 25, 2020

(54) METHOD AND DECODER TO ADJUST AN ERROR LOCATOR POLYNOMIAL BASED ON AN ERROR PARITY

(71) Applicant: SANDISK TECHNOLOGIES LLC, Plano, TX (US)

(72) Inventor: Ishai Ilani, Dolev (IL)

(73) Assignee: SANDISK TECHNOLOGIES LLC, Addison, TX (US)

( * ) Notice: Subject to any disclaimer, the term of this patent is extended or adjusted under 35 U.S.C. 154(b) by 357 days.

(21) Appl. No.: 15/343,866

(22) Filed: Nov. 4, 2016

(65) Prior Publication Data
US 2018/0129564 A1  May 10, 2018

(51) Int. Cl.
*G06F 11/10* (2006.01)
*G06F 3/06* (2006.01)
*H03M 13/15* (2006.01)
*H03M 13/00* (2006.01)

(52) U.S. Cl.
CPC ........ *G06F 3/0673* (2013.01); *G06F 11/1012* (2013.01); *H03M 13/152* (2013.01); *H03M 13/153* (2013.01); *H03M 13/155* (2013.01); *H03M 13/1525* (2013.01); *H03M 13/6502* (2013.01); *H03M 13/6561* (2013.01); *H03M 13/157* (2013.01); *H03M 13/1515* (2013.01); *H03M 13/1575* (2013.01)

(58) Field of Classification Search
CPC ..... H04L 1/0042; H04L 1/0057; H04L 1/005; H04L 1/0066; H03M 13/153; H03M 13/3746; H03M 13/6561; H03M 13/00; H03M 13/1128; H03M 13/157; H03M 13/1575; H03M 13/158; H03M 13/2906; H03M 13/617; H03M 13/1515; G06F 11/1076; G06F 3/0619; G06F 3/0673; G06F 3/064
See application file for complete search history.

(56) References Cited

U.S. PATENT DOCUMENTS

| | | | |
|---|---|---|---|
| 4,413,339 A | 11/1983 | Riggle et al. |
| 4,866,716 A | 9/1989 | Weng |
| 5,517,509 A | 5/1996 | Yoneda |
| 5,742,620 A | 4/1998 | Iwamura |
| 5,761,130 A | 6/1998 | Roohparvar |
| 6,031,875 A | 2/2000 | Im |
| 6,158,039 A | 12/2000 | Cho et al. |

(Continued)

FOREIGN PATENT DOCUMENTS

CN  101951265 A  1/2011

OTHER PUBLICATIONS

Lin et al., "A 2.56 Gb/s Soft RS (255, 239) Decoder Chip for Optical Communication Systems," IEEE Transactions on Circuits and Systems—I: Regular Papers, vol. 61, No. 7, Jul. 2014, 9 pages.

(Continued)

*Primary Examiner* — Phung M Chung
(74) *Attorney, Agent, or Firm* — Michael Best & Friedrich LLP

(57) ABSTRACT

A method of operation of a decoder includes receiving first data at the decoder. The method further includes generating second data at the decoder based on the first data. The second data is generated by adjusting an error locator polynomial based on an error parity of the first data.

26 Claims, 8 Drawing Sheets

(56) References Cited

U.S. PATENT DOCUMENTS

| | | | |
|---|---|---|---|
| 6,332,206 B1 | 12/2001 | Nakatsuji et al. | |
| 6,571,368 B1 | 5/2003 | Chen | |
| 6,662,334 B1 | 12/2003 | Stenfort | |
| 6,907,559 B2 | 6/2005 | Hall et al. | |
| 6,990,624 B2 | 1/2006 | Dohmen et al. | |
| 7,721,185 B1* | 5/2010 | Feng | H03M 13/1515 714/784 |
| 8,055,977 B2* | 11/2011 | Ito | G11B 20/1803 714/758 |
| 8,132,081 B1 | 3/2012 | Wu | |
| 8,301,986 B2 | 10/2012 | Jo et al. | |
| 8,301,987 B2 | 10/2012 | Dror et al. | |
| 8,335,974 B2 | 12/2012 | Wu | |
| 8,347,192 B1 | 1/2013 | Langhammer | |
| 8,433,935 B2* | 4/2013 | Piazza | G06F 1/3209 713/300 |
| 8,677,213 B2 | 3/2014 | Mizushima | |
| 8,732,553 B2 | 5/2014 | Nagadomi et al. | |
| 8,762,821 B2* | 6/2014 | Wu | G06F 11/1064 714/769 |
| 8,949,697 B1* | 2/2015 | Chang | H03M 13/1515 708/492 |
| 8,954,828 B2* | 2/2015 | Torii | H03M 13/09 714/755 |
| 8,959,418 B1 | 2/2015 | Pfister et al. | |
| 9,166,623 B1 | 10/2015 | Bates et al. | |
| 9,923,580 B2 | 3/2018 | Lee et al. | |
| 9,998,148 B2 | 6/2018 | Lin et al. | |
| 2010/0131807 A1* | 5/2010 | Truong | H03M 13/151 714/704 |
| 2010/0299580 A1* | 11/2010 | Neznanov | H03M 13/151 714/782 |
| 2011/0239094 A1 | 9/2011 | Kwok et al. | |
| 2012/0173951 A1 | 7/2012 | Kong et al. | |
| 2013/0262957 A1* | 10/2013 | Wu | G06F 11/1064 714/763 |
| 2014/0068392 A1* | 3/2014 | Kokubun | H03M 13/159 714/785 |
| 2014/0078820 A1 | 3/2014 | Li et al. | |
| 2014/0281839 A1 | 9/2014 | Kwok | |
| 2014/0281840 A1* | 9/2014 | Mula | H03M 13/1515 714/784 |
| 2016/0103735 A1 | 4/2016 | Lee et al. | |

OTHER PUBLICATIONS

Liu et al., "Low-Power High-Throughput BCH Error Correction VLSI Design for Multi-Level Cell NAND Flash Memories," 2006 IEEE Workshop on Signal Processing Systems Design and Implementation, Banff, Canada, Oct. 2-4, 2006, Oct. 1, 2006 IEEE, Piscataway, NJ, pp. 303-308.

Massey, "Shift-Register Synthesis and BCH Decoding," IEEE Transactions on Information Theory, vol. IT-15, No. 1, Jan. 1969, pp. 122-127.

Yoon et al., "A Discrepancy-Computationless RiBM Algorithm and Its Architecture for BCH Decoders," SOC Conference, 2008 IEEE International, Sep. 17, 2008 IEEE, Piscataway, NJ, pp. 379-382.

United States Patent Office Action for U.S. Appl. No. 15/373,313 dated Dec. 20, 2018 (15 pages).

United States Patent Office Action for U.S. Appl. No. 15/821,382 dated Jan. 25, 2019 (7 pages).

* cited by examiner

US 10,572,189 B2

METHOD AND DECODER TO ADJUST AN ERROR LOCATOR POLYNOMIAL BASED ON AN ERROR PARITY

FIELD OF THE DISCLOSURE

This disclosure is generally related to electronic devices and more particularly to decoders of electronic devices.

BACKGROUND

Data storage devices enable users to store and retrieve data. Examples of data storage devices include volatile memory devices and non-volatile memory devices. A non-volatile memory may retain data after a power-down event, and a volatile memory may lose data after a power-down event.

In some cases, data may be subject to one or more errors. For example, electrical noise may cause a logic "0" value to be read as a logic "1" value (or vice versa). Electrical noise may affect data within an electronic device as well as data that is sent via a network, such as a wireless network or a wired network. For example, a mobile phone may receive data that is affected by a wireless channel used to receive the data.

To enable correction of data errors, an encoder may encode data using an encoding scheme, such as by adding redundancy information to the data prior to storing the data to a memory or prior to transmitting the data. The encoding scheme may specify a codebook that associates data with codewords of the encoding scheme. A decoder may decode the data by using the redundancy information to locate and correct one or more data errors (up to a particular error correction capability of the encoding scheme).

Decoding data consumes power and clock cycles of a device. For example, a decoder may use an iterative decoding process to locate data errors, which utilizes power and one or more clock cycles for each iteration.

DETAILED DESCRIPTION

A device is configured to decode data using a decoding process that includes adjusting a length of an error locator polynomial based on an error parity associated with the data. As an illustrative example, by encoding the data using an "even" codebook that includes codewords each having an even number of logic "1" values, the device may determine whether a sensed representation of the data includes an even number of errors of an odd number of errors (i.e., whether the error parity is odd or even).

The error parity may enable the device to "condense" certain operations of a decoding process. For example, a decoding process may include iteratively adjusting the length of the error locator polynomial and checking whether the adjusted length is "correct" based on syndrome information associated with the data. In this example, the error parity may enable the device to adjust the length of the error locator polynomial by a value of two in some cases. To illustrate, if the length of the error locator polynomial is even (based on the error parity of the data to be decoded), then the device may "skip" adjusting the length to an odd number in some circumstances (e.g., by adjusting the length from a value of two to a value of four, as an illustrative example). Alternatively, if the length of the error locator polynomial is odd (based on the error parity of the data to be decoded), then the device may "skip" adjusting the length to an even number in some circumstances.

Use of the error parity to adjust the length of the error locator polynomial may reduce a number of clock cycles used to decode data. As a result, decoding latency and power consumption may be reduced.

Particular aspects of the disclosure are described below with reference to the drawings. In the description, common or similar features may be designated by common reference numbers. As used herein, "exemplary" may indicate an example, an implementation, and/or an aspect, and should not be construed as limiting or as indicating a preference or a preferred implementation.

Figure 1:
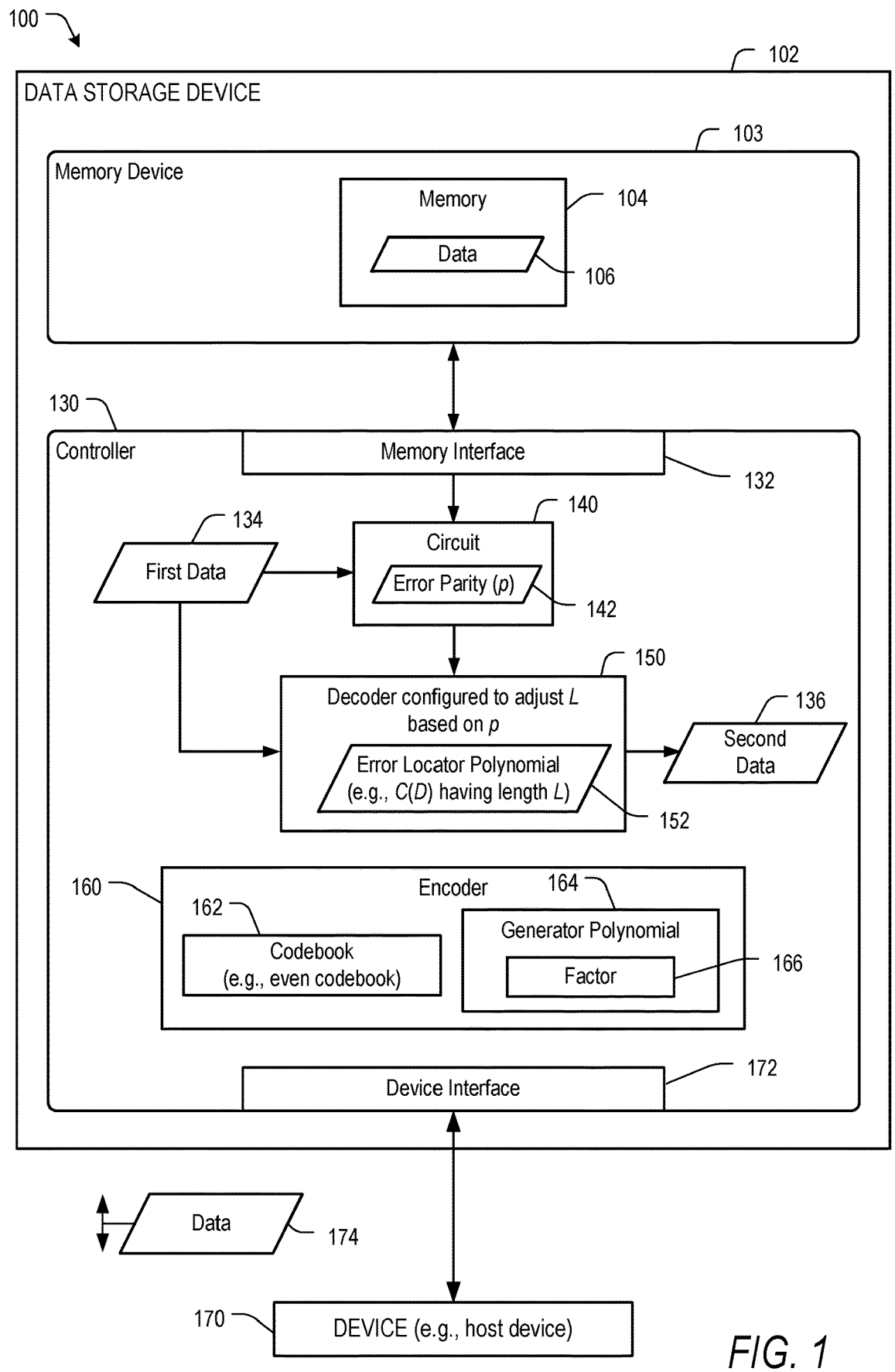
FIG. 1 is a diagram of a particular illustrative example of a system including a data storage device that includes a decoder configured to adjust a length of an error locator polynomial based on an error parity.

Referring to FIG. 1, a particular illustrative example of system is depicted and generally designated 100. The system 100 includes a data storage device 102 (e.g., an apparatus) and a device 170 (e.g., a host device or an access device). The data storage device 102 includes a memory device 103 and a controller 130. The controller 130 is coupled to the memory device 103. In some implementations, the data storage device 102 is integrated within the device 170, such as in connection with a solid-state drive (SSD) implementation.

The memory device 103 includes a memory 104, such as a non-volatile array of storage elements included in one or more memory dies. The memory 104 may include a flash memory (e.g., a NAND flash memory) or a resistive memory, such as a resistive random access memory (ReRAM), as illustrative examples. The memory 104 may have a three-dimensional (3D) memory configuration. As used herein, a 3D memory device may include multiple physical levels of storage elements (instead of having a single physical level of storage elements, as in a planar memory device). As an example, the memory 104 may have a 3D vertical bit line (VBL) configuration. In a particular implementation, the memory 104 is a non-volatile memory having a 3D memory array configuration that is monolithically formed in one or more physical levels of arrays of memory cells having an active area disposed above a silicon substrate. Alternatively, the memory 104 may have another configuration, such as a two-dimensional (2D) memory configuration or a non-monolithic 3D memory configuration (e.g., a stacked die 3D memory configuration).

The memory 104 includes one or more regions of storage elements. An example of a storage region is a block, such as a NAND flash erase group of storage elements, or a group of resistance-based storage elements in a ReRAM implementation. Another example of a storage region is a word line of storage elements (e.g., a word line of NAND flash storage elements or a word line of resistance-based storage elements). A storage region may have a single-level-cell (SLC) configuration, a multi-level-cell (MLC) configuration, or a tri-level-cell (TLC) configuration, as illustrative examples. Each storage element of the memory 104 may be programmable to a state (e.g., a threshold voltage in a flash configuration or a resistive state in a resistive memory configuration) that indicates one or more values. As an example, in an illustrative TLC scheme, a storage element may be programmable to a state that indicates three values. As an additional example, in an illustrative MLC scheme, a storage element may be programmable to a state that indicates two values.

The controller 130 includes a memory interface 132 to the memory device 103 and further includes a device interface 172 to the device 170. The controller 130 also includes a circuit 140 and a decoder 150. The circuit 140 is coupled to the decoder 150. The controller 130 further includes an encoder 160.

The encoder 160 is configured to encode data to generate one or more error correcting code (ECC) codewords using one or more ECC encoding techniques. The encoder 160 may be configured to encode data using an algebraic code. The encoder 160 may include a Reed-Solomon (RS) encoder, a Bose-Chaudhuri-Hocquenghem (BCH) encoder, an encoder configured to encode data according to one or more other ECC techniques, or a combination thereof.

The decoder 150 is configured to decode data read from the memory 104 to detect and correct, up to an error correction capability of the ECC scheme, one or more bit errors that may be present in the data. The decoder 150 may be configured to decode data using an algebraic code. The decoder 150 may include an RS decoder, a BCH decoder, a decoder configured to decode data according to one or more other ECC techniques, or a combination thereof. In some implementations, the decoder 150 is configured to operate in accordance with one or more of a Berlekamp-Massey (BM) technique or a Peterson-Gorenstein-Zierler (PGZ) technique.

During operation, the controller 130 may receive data 174 from the device 170, such as in connection with a request for write access to the memory 104. The controller 130 may input the data 174 to the encoder 160 to generate encoded data, such as data 106. As an illustrative example, the data 174 may be encoded in accordance with a BCH code to generate the data 106.

The data 106 may include one or more codewords associated with a codebook 162 of a particular code (e.g., a BCH code, as an illustrative example) that is used to generate the data 106. In an illustrative example, each codeword indicated by the codebook 162 may include an even number of logic one values (i.e., the codebook 162 may correspond to an "even codebook").

The encoder 160 may be configured to generate a set of codewords each having an even number of logic one values. For example, the encoder 160 may be configured to encode the data 174 using a generator polynomial 164 having a factor 166 selected to cause each codeword of the set of codewords to have an even number of logic one values. To illustrate, the generator polynomial 164 may correspond to g(x)*(1+x), where g(x) is a generator function of a BCH code and (1+x) corresponds to the factor 166.

The controller 130 may be configured to send the data 106 to the memory device 103. The memory device 103 may store the data 106 to a particular region of the memory 104.

The controller 130 may access the data 106 from the memory 104. As an illustrative example, the controller 130 may receive a request for read access to the data 106. The controller 130 may send a read command to the memory device 103 to initiate reading of the data 106. In response to the read command, the memory device 103 may sense the data 106 to generate sensed data, such as first data 134. The first data 134 may differ from the data 106 due to one or more errors. The memory device 103 may provide the first data 134 to the controller 130.

The controller 130 may input the first data 134 to the circuit 140. For example, the circuit 140 may be coupled to the memory interface 132 and may receive the first data 134 from the memory interface 132. The circuit 140 is configured to determine an error parity 142 (also referred to herein as "p") of the first data 134. To illustrate, if the codebook 162 corresponds to an "even" codebook, the circuit 140 may be configured to determine the error parity 142 based on whether the first data 134 indicates an even number of logic one values or an odd number of logic one values.

To further illustrate, the circuit 140 may identify (e.g., count) a number of logic one values included in the first data 134. In this example, the error parity 142 corresponds to a difference between the number of logic one values and a codeword parity that is associated with each codeword of an encoding scheme used to encode the first data 134. In an illustrative implementation, the circuit 140 is configured to set the error parity 142 to a particular logic value (e.g., a logic zero value) in response to determining that the number of logic one values included in the first data 134 is even. In this example, the circuit 140 may be further configured to set the error parity 142 to another logic value (e.g., a logic one value) in response to determining that the number of logic one values included in the first data 134 is odd.

The decoder 150 is configured to receive the first data 134 (e.g., from the circuit 140 or from the memory interface 132). The decoder 150 is further configured to receive an indication of the error parity 142 from the circuit 140. The decoder 150 is configured to decode the first data 134 to generate second data 136. The second data 136 may correspond to the data 174 (e.g., an error-corrected version of the first data 134), as an illustrative example.

The decoder 150 is configured to generate the second data 136 by adjusting an error locator polynomial 152 (also referred to herein as "C(D)") based on the error parity 142 of the first data 134. The error locator polynomial 152 has a length L, such as a positive integer number of coefficients of the error locator polynomial 152, as an illustrative example.

To further illustrate, the decoder 150 may be configured to perform a decoding process that includes one or more iterations to decode the first data 134. The decoding process may include adjusting the length L based on an estimated number of errors of the first data 134, such as by iteratively increasing the length L. After adjusting the length L, the decoder 150 may use the error locator polynomial 152 to correct one or more errors of the first data 134. By accessing the error parity 142, the decoder 150 may omit (or "skip") certain iterations of the decoding process in some cases, such as by skipping adjusting the length of the error locator polynomial 152 to an even value or to an odd value based on the error parity 142 in certain iterations of the decoding process. In this case, the decoder 150 may be configured to adjust the length L by a value of two.

The decoder 150 may be configured to adjust the length L by a particular value based on a comparison of the error parity 142 to a parity of the error locator polynomial 152. For example, the decoder 150 may be configured to increase the length L by a value of two if the error parity 142 is equal to a parity of the error locator polynomial 152. As another example, the decoder 150 may be configured to increase the length L by a value of one if the error parity 142 is not equal to a parity of the error locator polynomial 152.

The decoder 150 may be configured to adjust the length L (e.g., by a value of two or by a value of one) in a single iteration of a decoding process to decode the first data 134. For example, the decoder 150 may be configured to decode the first data 134 in accordance with an improved BM technique to generate the second data 136. In this example, by increasing the length L by a value of two in certain iterations, the decoder 150 may be configured to "condense" operations of two iterations of the BM technique into a single iteration (e.g., to perform the two iterations of an improved BM decoding process in parallel). As another example, the decoder 150 may be configured to decode the first data 134 in accordance with an improved PGZ technique to generate the second data 136.

To further illustrate, the pseudo-code of Example 1 illustrates certain operations that may be performed in connection with an improved BM decoding process. In order to understand the example, it may be beneficial to look first at another version of the BM algorithm for decoding primitive narrow sense BCH codes:

```
Initialize: C(D)=1, B(D)=1, x=1, L=0, b=1, T=0.
While T < t,
    d = Σ_{i=0}^{L} c_i S_{2T+1-i}
    If d==0,
        x=x+2
    elseif L > T
        C(D) = bC(D)+dD^x B(D)
        x = x + 2
    else
        tmpC = C(D)
        L = 2T + 1 − L
        C(D) = bC(D)+dD^x B(D)
        B(D) = tmpC
        b = d
        x = 2
    end
    T = T + 1
end
```

In the BM algorithm, for a narrow sense BCH code, each change to the length L of C(D) results in a change of the parity of the length from odd to even or from even to odd. This follows from the equation relating the "new" length (Lnew) to the current length (L): Lnew=2T+1−L.

If the "correct" parity of L is known in advance, and if the length L is updated on two successive iterations, then two iterations may be performed at once, thus reversing the parity twice (or "preserving" the parity of L during the BM algorithm). This may speed up the BM algorithm and may reduce the time for convergence of the algorithm by up to 50%. A condition is that both L≤T and Lnew=2T+1−L≤T+1, which has the solution L=T.

Therefore, if the parity of the length of the "true" C(D) is known in advance, the BM algorithm may be modified to the IBM algorithm as depicted below in example 1. The decoder 150 may be configured to operate in accordance with the pseudo-code of Example 1.

Example 1

```
Initialize: C(D)=1, B(D)=1, x=1, L=0, b=1, T=0, p = parity of
    error num
While T < t,
    d = Σ_{i=0}^{L} c_i S_{2T+1-i}
    If d==0,
        x=x+2; T=T+1
    elseif L > T
        C(D) = bC(D) + dD^x B(D)
        x = x+2; T=T+1
    elseif L==T && parity(L)==p
        e_1 = Σ_{i=0}^{L} c_i S_{2T+3-i}
        e_2 = Σ_{i=0}^{L+1-x} b_i S_{2T+3-i-x}
        tmpC = bC(D) + dD^x B(D)
        L=L+2
        C(D) = (db + (be_1+de_2)D^2)C(D) + d^2 D^x B(D)
        B(D) =tmpC; b=be_1+de_2; x=2; T = T+2
    else
        tmpC = C(D)
        L=2T+1−L
        C(D) = bC(D) + dD^x B(D)
        B(D) =tmpC; b=d; x=2; T = T+1
    end
end
```

In Example 1, C(D) may correspond to the error locator polynomial 152, and D may indicate a variable of the error locator polynomial. L may correspond to the degree of the error locator polynomial 152 (also referred to herein as the length of the error locator polynomial 152), and t may indicate an error correction capability associated with the particular ECC scheme. T may indicate (e.g., track) a number of iterations performed in a particular decoding process, and B(D) may indicate a previous estimation of C(D) (e.g., prior to adjusting L).

During a decoding process performed in accordance with Example 1, L may be increased iteratively. In certain iterations, a first iteration and a second iteration may be performed in parallel (instead of performing the first iteration and then checking whether convergence is satisfied or if the conditions for performing the second iteration are satisfied). In this case, L may be increased by two (i.e., L=L+2). These iterations occur if the error parity p corresponds to the current estimated degree L of C(D) (i.e., if parity(L)==p) and if the iteration number T is equal to the degree L. In this case, two iterations of the decoding process may be "condensed" into a single iteration and L may be incremented by two.

By "condensing" operations of two iterations of a decoding process into a single iteration, data may be decoded more quickly. As a result, performance of the data storage device 102 may be improved.

Figure 2:
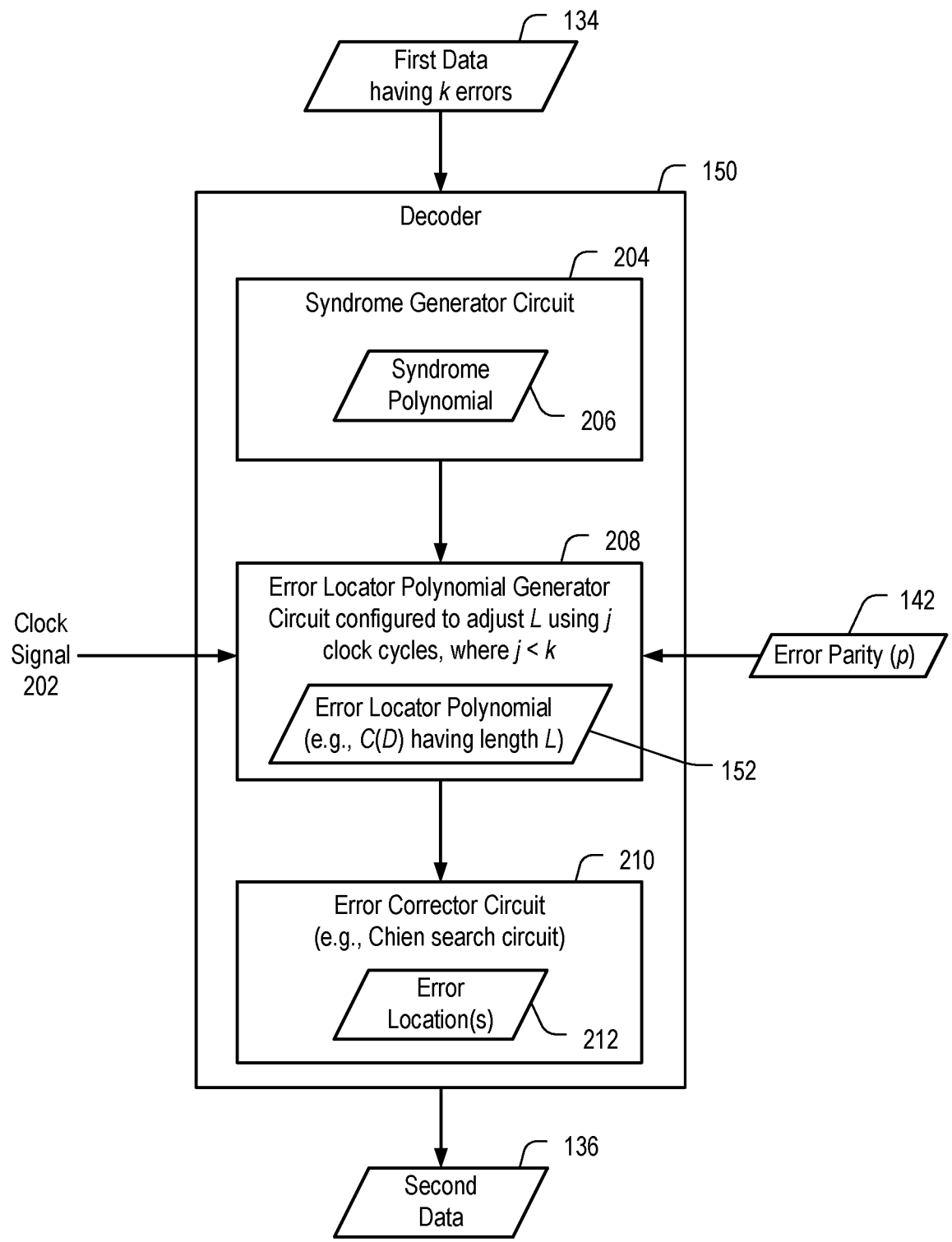
FIG. 2 is a diagram illustrating aspects of a particular example of the decoder of FIG. 1.

FIG. 2 illustrates certain aspects of an illustrative example of the decoder 150 of FIG. 1. In the example of FIG. 2, the decoder 150 includes a syndrome generator circuit 204, an error locator polynomial generator circuit 208, and an error corrector circuit 210. The syndrome generator circuit 204 is coupled to the error locator polynomial generator circuit 208, and the error locator polynomial generator circuit 208 is coupled to the error corrector circuit 210.

During operation, the syndrome generator circuit 204 may receive the first data 134. The first data 134 may include k errors (where k is a positive integer number). The syndrome generator circuit 204 may be configured to generate a syndrome polynomial 206 based on the first data 134.

The error locator polynomial generator circuit 208 may be configured to receive the syndrome polynomial 206, an indication of the error parity 142, and a clock signal 202. The error locator polynomial generator circuit 208 may be configured to generate the error locator polynomial 152 based on the syndrome polynomial 206 and to adjust the length L of the error locator polynomial 152 based on the error parity 142.

The error locator polynomial generator circuit 208 may be configured to perform operations based on the clock signal 202. For example, one iteration of the while loop of Example 1 may be performed during each cycle of the clock signal 202. Generating the error locator polynomial 152 and adjusting the length L of the error locator polynomial 152 may thus be performed based on the clock signal 202. The error locator polynomial generator circuit 208 may be configured to adjust coefficients of the error locator polynomial 152 based on the syndrome polynomial 206 and based on the clock signal 202. The error locator polynomial generator circuit 208 may be configured to adjust the length L of the error locator polynomial 152 until determining that the length L is "correct" based on the syndrome polynomial 206. For example, the error locator polynomial generator circuit 208 may be configured to determine that the error locator polynomial 152 is "correct" based on a product of the error locator polynomial 152 and the syndrome polynomial 206. After adjusting the error locator polynomial 152, the error locator polynomial generator circuit 208 may provide the error locator polynomial 152 to the error corrector circuit 210.

In the example of FIG. 2, the error locator polynomial generator circuit 208 is configured to generate the error locator polynomial 152 using j clock cycles of the clock signal 202 (where j is a positive integer number). The number of clock cycles j is less than the number of errors k of the first data 134 (i.e., j<k). For example, by "condensing" at least two iterations of a decoding process performed by the decoder 150 into one clock cycle of the clock signal 202, k errors of the first data 134 may be corrected using j clock cycles. In some examples, the number of clock cycles (j) is less than three-fourths of the number of errors (k) of the first data 134. In another example, the number of clock cycles (j) is approximately half of the number of errors (k) of the first data 134. In other examples, j and k may have a different relation.

The error corrector circuit 210 may be configured to determine one or more error locations 212 of the first data 134 based on the error locator polynomial 152. For example, the error corrector circuit 210 may include a Chien search circuit configured to perform a Chien search of the error locator polynomial 152 to determine the one or more error locations 212 of the first data 134. In an illustrative example, the error corrector circuit 210 is configured to determine the one or more error locations 212 by determining a set of roots of the error locator polynomial 152. In certain cases (e.g., if L≤4), then the roots of the error locator polynomial 152 may be solved for analytically (e.g., instead of using a Chien search).

The error corrector circuit 210 may be configured to adjust values of the first data 134 based on the one or more error locations 212 to generate the second data 136. For example, the error corrector circuit 210 may "flip" one or more bits of the first data 134 based on the one or more error locations 212 to generate the second data 136. The second data 136 may correspond to the data 174 of FIG. 1, as an illustrative example.

The example of FIG. 2 illustrates that in some cases the error locator polynomial generator circuit 208 may generate the error locator polynomial 152 using j clock cycles of the clock signal 202. In the example of FIG. 2, j is less than the number of errors k of the first data 134. Because j<k, performance of the decoder 150 may be improved as compared to a device that uses at least one clock cycle for each error to generate an error locator polynomial.

Figure 3:
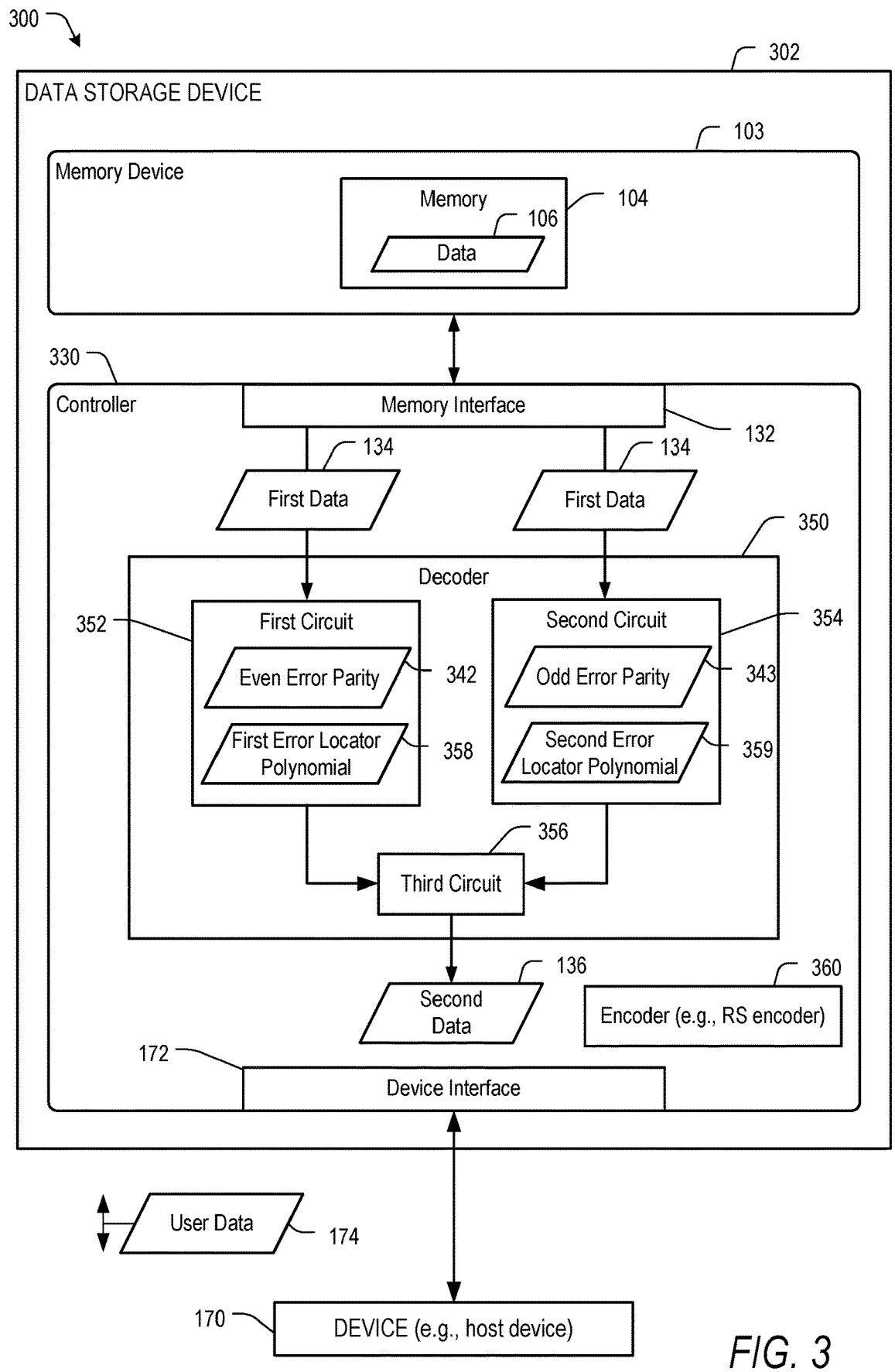
FIG. 3 is a diagram of a particular illustrative example of a system including a data storage device that includes a decoder configured to adjust a length of a first error locator polynomial based on an even error parity and to adjust a length of a second error locator polynomial based on an odd error parity.

Referring to FIG. 3, a particular illustrative example of system is depicted and generally designated 300. The system 300 includes a data storage device 302 (e.g., an apparatus) and the device 170 (e.g., a host device or an access device). The data storage device 302 includes the memory device 103 and a controller 330. The controller 330 is coupled to the memory device 103. In some implementations, the data storage device 302 is integrated within the device 170, such as in connection with an SSD implementation. The memory device 103 includes the memory 104.

The controller 330 includes the memory interface 132 to the memory device 103 and further includes the device interface 172 to the device 170. The controller 330 also includes a decoder 350 and an encoder 360. The decoder 350 includes a first circuit 352, a second circuit 354, and a third circuit 356 coupled to the first circuit 352 and to the second circuit 354. In some implementations, the decoder 350 further includes the syndrome generator circuit 204 and the error corrector circuit 210 of FIG. 2. The first circuit 352 and the second circuit 354 each include a circuit corresponding to error locator polynomial generator circuit 208 of FIG. 2.

The encoder 360 is configured to encode data to generate one or more ECC codewords using one or more ECC encoding techniques. The encoder 360 may include an RS encoder, a BCH encoder, an encoder configured to encode data according to one or more other ECC techniques, or a combination thereof.

The decoder 350 is configured to decode data read from the memory 104 to detect and correct, up to an error correction capability of the ECC scheme, one or more bit errors that may be present in the data. The decoder 350 may include an RS decoder, a BCH decoder, a decoder configured to decode data according to one or more other ECC techniques, or a combination thereof.

The circuits 352, 354 may be configured to perform certain operations in parallel. To illustrate, the decoder 350 may be configured to perform multiple iterations of a BM decoding process in parallel using the circuits 352, 354.

During operation, the controller 330 may receive the data 174 from the device 170, such as in connection with a request for write access to the memory 104. The controller 330 may input the data 174 to the encoder 360 to generate encoded data, such as the data 106. As an illustrative example, the data 174 may be encoded in accordance with an RS code or in accordance with a BCH code to generate the data 106.

The controller 330 may be configured to send the data 106 to the memory device 103. The memory device 103 may store the data 106 to a particular region of the memory 104.

The controller 330 may access the data 106 from the memory 104. As an illustrative example, the controller 330 may receive a request for read access to the data 106. The controller 330 may send a read command to the memory device 103 to initiate reading of the data 106. In response to the read command, the memory device 103 may sense the data 106 to generate sensed data, such as first data 134. The first data 134 may differ from the data 106 due to one or more errors. The first data 134 may include a set of symbols (or a representation of the symbols) encoded in accordance with an RS code or a BCH code, as illustrative examples. The memory device 103 may provide the first data 134 to the controller 330.

The controller 330 may input the first data 134 to the first circuit 352 and to the second circuit 354. In an illustrative example, the controller 330 is configured to input the first data 134 to the first circuit 352 and to the second circuit 354 in parallel (e.g., during a common clock cycle of a clock signal used by the controller 330).

The decoder 150 may be configured to determine a syndrome polynomial based on the first data 134. For example, the decoder 350 may include the syndrome generator circuit 204 of FIG. 2. The first circuit 352 may be coupled to receive the syndrome polynomial 206 of FIG. 2. The second circuit 354 may also be coupled to receive the syndrome polynomial 206 of FIG. 2.

In some examples, the first data 134 includes a set of symbols (e.g., in accordance with a non-binary encoding technique that uses symbols to represent data). In some circumstances, determining an error parity associated with a set of symbols may be inefficient or infeasible. The decoder 350 may be configured to separately "assume" both an even error parity and an odd parity of the first data 134 and to perform operations based on the even error parity and the odd error parity in parallel.

The first circuit 352 is configured to receive the first data 134 and to perform a set of decoding operations based on the first data 134 by adjusting a first error locator polynomial 358 based on an even error parity of the first data 134. In the example of FIG. 3, instead of determining the error parity 142 as described with reference to FIGS. 1 and 2, the first circuit 352 may "assume" that an error parity of the first data 134 is even (e.g., based on an even error parity 342 of the first data 134). The first circuit 352 may adjust a length L of the first error locator polynomial 358 as described with reference to FIG. 1 based on the even error parity 342 (e.g., instead of using the error parity 142 of FIG. 1).

The second circuit 354 is configured to receive the first data 134 and to perform the set of decoding operations (e.g., a set of decoding operations performed in accordance with a BM decoding technique, as an illustrative example) by adjusting a second error locator polynomial 359 based on an odd error parity of the first data 134. In the example of FIG. 3, instead of determining the error parity 142 using the circuit 140 as described with reference to FIGS. 1 and 2, the second circuit 354 may "assume" that an error parity of the first data 134 is odd (e.g., based on an odd error parity 343 of the first data 134). The second circuit 354 may adjust a length L of the second error locator polynomial 359 as described with reference to FIG. 1 based on the odd error parity 343 (e.g., instead of using the error parity 142 of FIG. 1).

The third circuit 356 is configured to select an output of the first circuit 352 or the second circuit 354. For example, the first circuit 352 may be configured to provide the first error locator polynomial 358 to the third circuit 356, and the second circuit 354 may be configured to provide the second error locator polynomial 359 to the third circuit 356. The third circuit 356 may be configured to select either the first error locator polynomial 358 or the second error locator polynomial 359 based on whether the "correct" parity of the first data 134 is even or odd. For example, the third circuit 356 may be configured to select the output of the first circuit 352 or the second circuit 354 in response to detecting that the output satisfies convergence criteria associated with a code (e.g., an RS code or a BCH code) associated with the first data 134. Determining whether the convergence criteria are satisfied may include determining which of the error locator polynomials 358, 359 corresponds to the syndrome polynomial 206 of FIG. 2. The output of the first circuit 352 may satisfy the convergence criteria if the "correct" parity of the first data 134 is even, and the output of the second circuit 354 may satisfy the convergence criteria if the "correct" parity of the first data 134 is odd.

In some implementations, the third circuit 356 may include a comparator circuit and a multiplexer (MUX) circuit coupled to the comparator circuit. The comparator circuit may be configured to determine which of the first error locator polynomial 358 and the second error locator polynomial 359 satisfies the convergence criteria. The comparator circuit may be configured to provide a signal to the MUX circuit. The signal may have one of a first value to indicate that the first error locator polynomial 358 satisfies the convergence criteria or a second value to indicate that the second error locator polynomial 359 satisfies the convergence criteria. The MUX circuit may select the first error locator polynomial 358 or the second error locator polynomial 359 based on the signal.

The third circuit 356 may be configured to perform decoding of the first data 134 based on the selected output of the circuits 352, 354 (i.e., based on the first error locator polynomial 358 or the second error locator polynomial 359). For example, the third circuit 356 may include the error corrector circuit 210 of FIG. 2. In this example, the error corrector circuit 210 may be configured to receive the selected output (i.e., the first error locator polynomial 358 or the second error locator polynomial 359) and to identify the one or more error locations 212 of FIG. 2 based on the selected output. The error corrector circuit 210 may be configured to correct one or more errors of the first data 134 based on the one or more error locations 212 of FIG. 2 to generate the second data 136.

By determining the error locator polynomials 358, 359 in parallel using the circuits 352, 354, the decoder 350 may reduce a number of clock cycles associated with determining error locator information. Such a technique may be used to improve performance in certain applications, such as in connection with a non-binary encoding technique that uses symbols to represent data, in which case determining the error parity 142 of FIG. 1 may be inefficient or infeasible.

Figure 4:
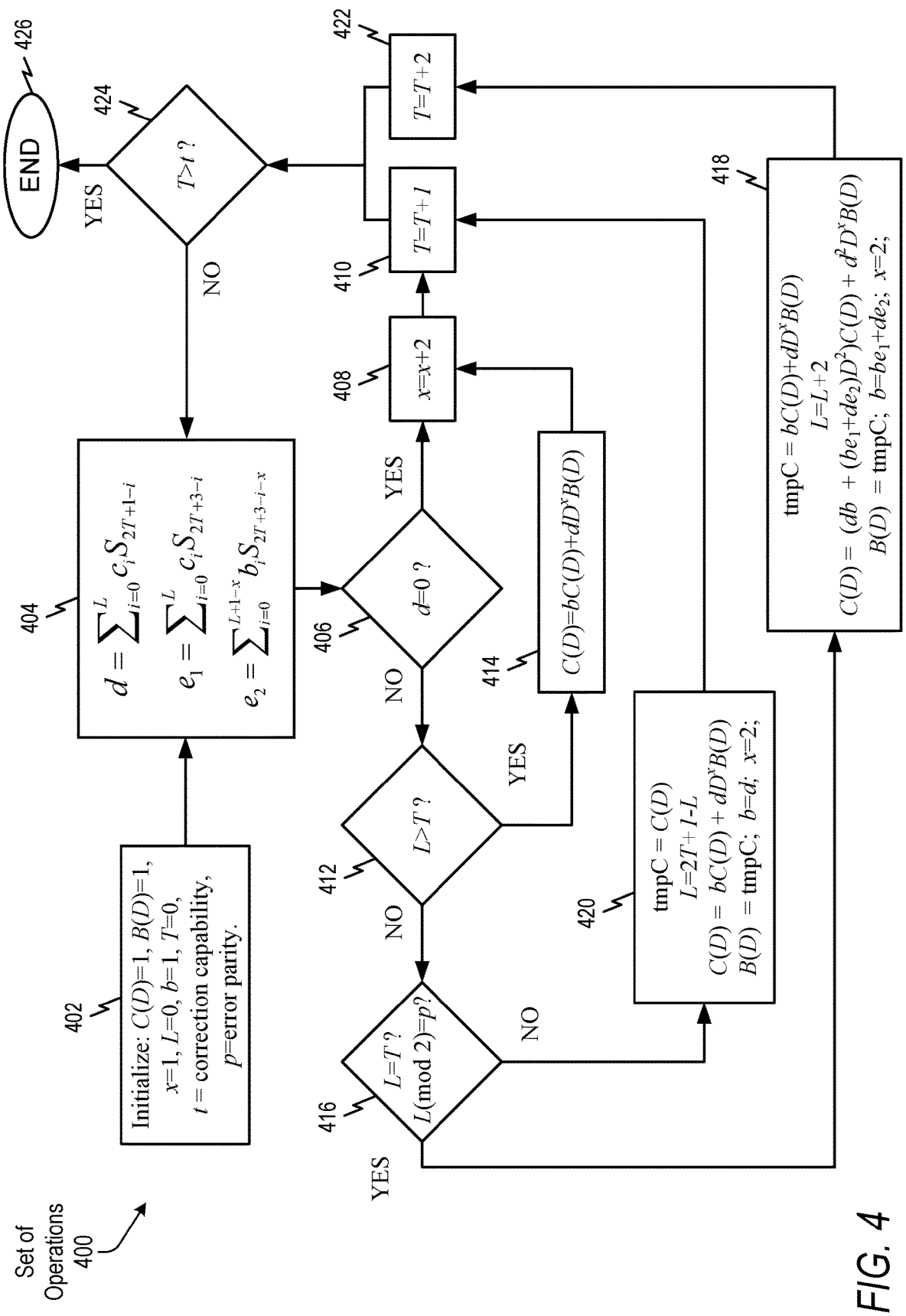
FIG. 4 is a flow chart of a particular illustrative example of a set of operations that may be performed by a decoder, such as one or more of the decoders of FIGS. 1-3.

FIG. 4 is a flow chart of an illustrative example of a set of operations 400. One or more operations of the set of operations 400 may be performed at the decoder 150, at the decoder 350, or a combination thereof. The set of operations 400 may correspond to operations indicated by the pseudocode of Example 1.

The operations 400 include an initialization operation, at 402. The initialization operation may include setting C(D), B(D), x, and b to one and setting L and T to zero. The initialization operation may include setting p to a value of the error parity 142 (e.g., to zero if the first data 134 has an even number of "1" values or to one if the first data 134 has an odd number of "1" values, as an illustrative example). In another example, the initialization operation may include setting p to a value of the even error parity 342 (e.g., by the first circuit 352) or setting p to a value of the odd error parity 343 (e.g., by the second circuit 354).

The operations 400 further include a set of summation operations, at 404. The set of summation operations may include determining d, $e_1$, and $e_2$.

At 406, a determination is made whether d=0. If d=0, then the set of operations further includes increasing x by two (x=x+2), at 408, and increasing T (the iteration counter) by one (T=T+1), at 410. Otherwise, a determination is made whether L>T, at 412.

If L>T, the operations 400 further include adjusting C(D) based on $C(D)=bC(D)+dD^xB(D)$, at 414. Otherwise, a determination is made whether the current degree L of the locator polynomial is equal to the iteration counter T (L=T) and whether the parity of L is equal to the parity of the errors (L(mod 2)=p), at 416.

If L=T and L(mod 2)=p, the operations 400 further include a first set of operations, at 418. The first set of operations may correspond to a "dual-iteration" of a BM decoding process where L is increased by two. In this case, the operations 400 further include increasing T by two, at 422 (e.g., to indicate that operations of two iterations have been performed).

Otherwise, the operations 400 further include a second set of operations, at 420. The second set of operations may correspond to a "single iteration" of a BM decoding process where L is incremented by one. In this case, the operations 400 further include increasing T by two, at 410 (e.g., to indicate that operations of two iterations have been performed).

A determination may be made whether the iteration counter is greater than the error correction capability (T>t), at 424. If T≤t, the operations 400 may continue by performing the set of summation operations, at 404. Otherwise, if T>t, the operations 400 may end, at 426.

Figure 5:
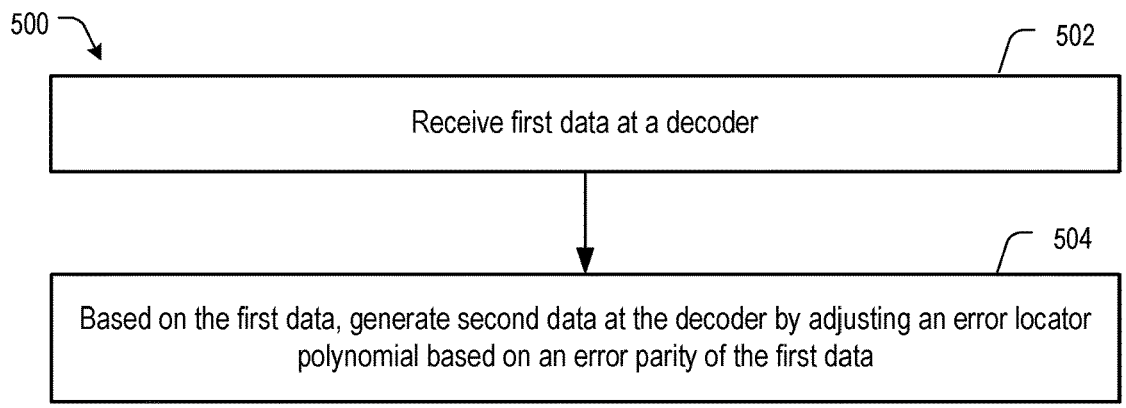
FIG. 5 is a flow chart of a particular illustrative embodiment of a method of operation of a decoder, such as the decoder of FIG. 1, the decoder of FIG. 2, or both.

Referring to FIG. 5, an illustrative example of a method is depicted and generally designated 500. The method 500 may be performed by a decoder, such as the decoder 150, as an illustrative example.

The method 500 includes receiving first data at the decoder, at 502. For example, the decoder 150 may receive the first data 134.

The method 500 further includes generating second data at the decoder based on the first data, at 504. Generating the second data includes adjusting an error locator polynomial based on an error parity of the first data. To illustrate, the decoder 150 may generate the second data 136 by adjusting the length L of the error locator polynomial 152 based on the error parity 142.

Figure 6:
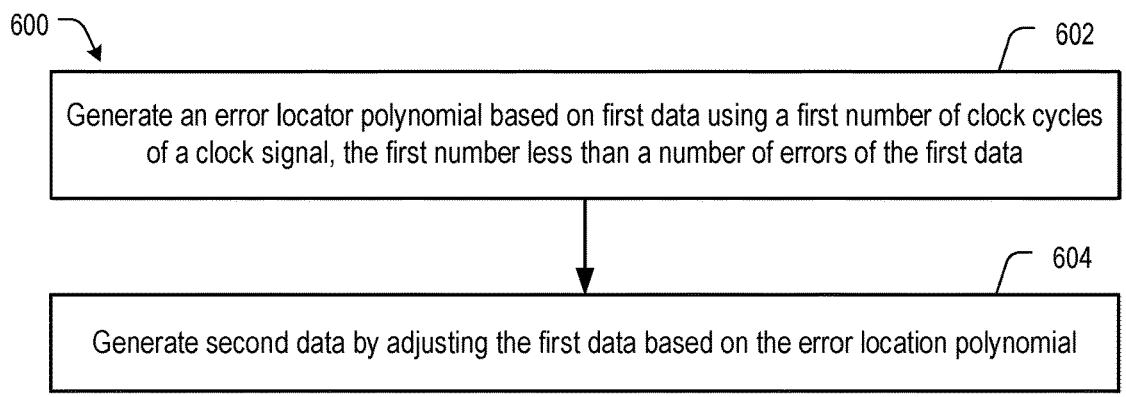
FIG. 6 is a flow chart of another particular illustrative embodiment of a method of operation of a decoder, such as the decoder of FIG. 1, the decoder of FIG. 2, or both.

Referring to FIG. 6, another illustrative example of a method is depicted and generally designated 600. The method 600 may be performed by a decoder, such as the decoder 150, as an illustrative example.

The method 600 includes generating an error locator polynomial based on first data using a first number of clock cycles of a clock signal, at 602. The first number is less than a number of errors of the first data. To illustrate, the first data 134 may include k errors, and the decoder 150 may generate the error locator polynomial 152 using j clock cycles of the clock signal 202, where j<k.

The method 600 further includes generating second data by adjusting the first data based on the error locator polynomial, at 604. As an illustrative example, the error corrector circuit 210 may identify the one or more error locations 212 based on the error locator polynomial 152, and the decoder 150 may adjust values of the first data 134 based on the one or more error locations 212 to generate the second data 136.

Figure 7:
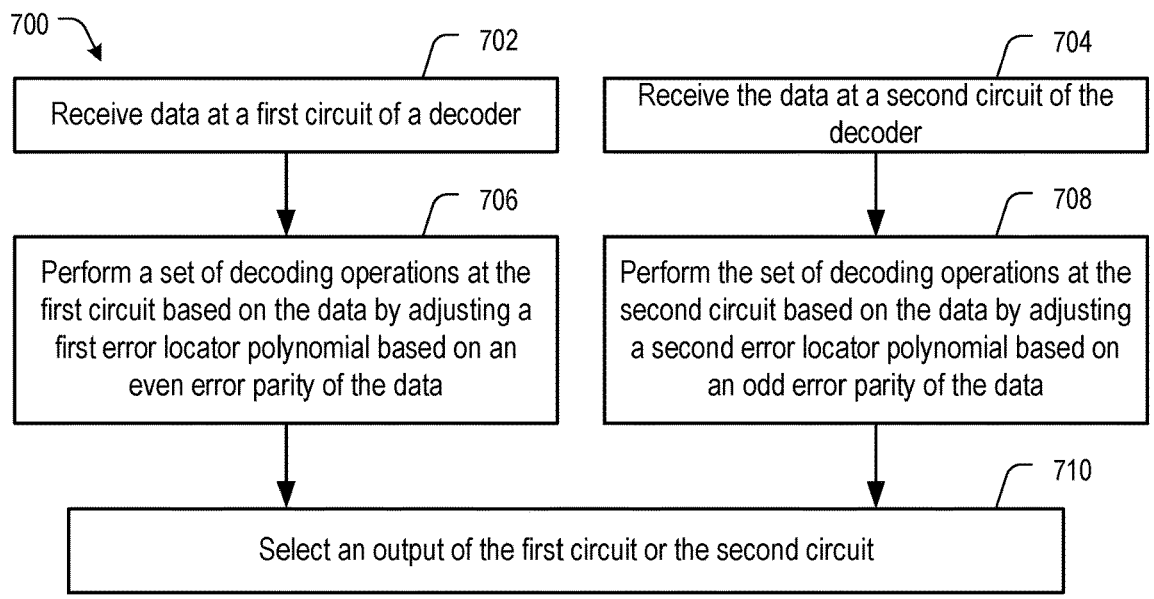
FIG. 7 is a flow chart of another particular illustrative embodiment of a method of operation of a decoder, such as the decoder of FIG. 3.

Referring to FIG. 7, another illustrative example of a method is depicted and generally designated 700. The method 700 may be performed by a decoder, such as the decoder 350, as an illustrative example.

The method 700 includes receiving data at a first circuit of the decoder, at 702, and receiving the data at a second circuit of the decoder, at 704. For example, the first circuit 352 and the second circuit 354 may receive the first data 134. In an illustrative example, the first circuit 352 and the second circuit 354 receive the first data 134 in parallel (e.g., during a common clock cycle).

The method 700 further includes performing a set of decoding operations at the first circuit based on the data by adjusting a first error locator polynomial based on an even error parity of the data, at 706. As an illustrative example, the first circuit 352 may adjust a length of the first error locator polynomial 358 based on the even error parity 342.

The method 700 further includes performing the set of decoding operations at the second circuit based on the data by adjusting a second error locator polynomial based on an odd error parity of the data, at 708. As an illustrative example, the second circuit 354 may adjust a length of the second error locator polynomial 359 based on the odd error parity 343.

In an illustrative example, the first circuit 352 performs the set of decoding operations in parallel with the set of decoding operations performed by the second circuit 354 (e.g., during a common set of clock cycles). The set of decoding operations may include one or more operations described with reference to the pseudo-code of Example 1, one or more operations of the set of operations 400 of FIG. 4, or a combination thereof, as an illustrative example.

The method 700 further includes selecting an output of the first circuit or the second circuit, at 710. For example, the third circuit 356 may select the first error locator polynomial 358 or the second error locator polynomial 359 as the output.

Figure 8:
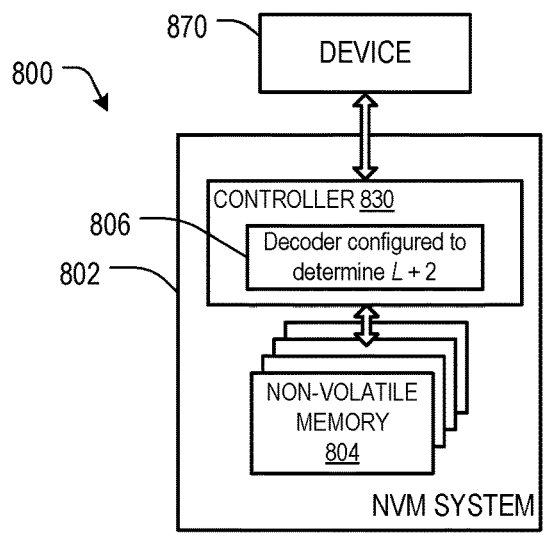
FIG. 8 is a block diagram of a particular illustrative embodiment of a non-volatile memory system that includes a data storage device, such as the data storage device of FIG. 1, the data storage device of FIG. 3, or both.

Referring to FIG. 8, a system 800 includes a non-volatile memory system 802 (e.g., the data storage device 102 or the data storage device 302) that may be coupled to a device 870 (e.g., the device 170). The non-volatile memory system 802 includes a controller 830 (e.g., the controller 130 or the controller 330) and non-volatile memory that may be made up of one or more non-volatile memory dies 804 (e.g., one or more memory dies included in the memory device 103). As used herein, the term "memory die" refers to the collection of non-volatile memory cells, and associated circuitry for managing the physical operation of those non-volatile memory cells, that are formed on a single semiconductor substrate. The controller 830 interfaces with the device 870 and transmits command sequences for read, program, and erase operations to the one or more non-volatile memory dies 804.

The controller 830 includes a decoder 806 configured to adjust a length L of an error locator polynomial (e.g., the error locator polynomial 152) by a value of two. The decoder 806 may correspond to the decoder 150, as an illustrative example.

The controller 830 (which may be a flash memory controller) may take the form of processing circuitry, a microprocessor or processor, and a computer-readable medium that stores computer-readable program code (e.g., firmware) executable by the (micro)processor, logic gates, switches, an application specific integrated circuit (ASIC), a programmable logic controller, and an embedded microcontroller, for example. The controller 830 may be configured with hardware and/or firmware to perform the various functions described below and shown in the flow diagrams. Also, some of the components shown as being internal to the controller 830 can be stored external to the controller 830, and other components can be used. Additionally, the phrase "operatively in communication with" could mean directly in communication with or indirectly (wired or wireless) in communication with through one or more components, which may or may not be shown or described herein.

As used herein, a flash memory controller is a device that manages data stored on flash memory and communicates with a host, such as a computer or electronic device. A flash memory controller can have various functionality in addition to the specific functionality described herein. For example, the flash memory controller can format the flash memory, map out bad flash memory cells, and allocate spare cells to be substituted for future failed cells. Some part of the spare cells can be used to hold firmware to operate the flash memory controller and implement other features. In operation, when a host device is to read data from or write data to the flash memory, the host device communicates with the flash memory controller. If the host device provides a logical address to which data is to be read/written, the flash memory controller can convert the logical address received from the host device to a physical address in the flash memory. (Alternatively, the host device can provide the physical address.) The flash memory controller can also perform various memory management functions, such as, but not limited to, wear leveling (distributing writes to avoid wearing out specific blocks of memory that would otherwise be repeatedly written to) and garbage collection (after a block is full, moving only the valid pages of data to a new block, so the full block can be erased and reused).

The one or more non-volatile memory dies 804 may include any suitable non-volatile storage medium, including NAND flash memory cells and/or NOR flash memory cells. The memory cells can take the form of solid-state (e.g., flash) memory cells and can be one-time programmable, few-time programmable, or many-time programmable. The memory cells can also be single-level cells (SLC), multiple-level cells (MLC), triple-level cells (TLC), or use other memory cell level technologies, now known or later developed. Also, the memory cells can be fabricated in a two-dimensional or three-dimensional fashion.

The interface between the controller 830 and the one or more non-volatile memory dies 804 may be any suitable flash interface, such as Toggle Mode 200, 400, or 800. In one embodiment, the non-volatile memory system 802 may be a card based system, such as a secure digital (SD) or a micro secure digital (micro-SD) card. In an alternate embodiment, the non-volatile memory system 802 may be part of an embedded memory system.

Although, in the example illustrated in FIG. 8, the non-volatile memory system 802 (sometimes referred to herein as a storage module) includes a single channel between the controller 830 and the one or more non-volatile memory dies 804, the subject matter described herein is not limited to having a single memory channel. For example, in some NAND memory system architectures (such as the ones shown in FIGS. 9 and 10), 2, 4, 8 or more NAND channels may exist between the controller 830 and the NAND memory device, depending on controller capabilities. In any of the embodiments described herein, more than a single channel may exist between the controller 830 and the one or more non-volatile memory dies 804, even if a single channel is shown in the drawings.

Figure 9:
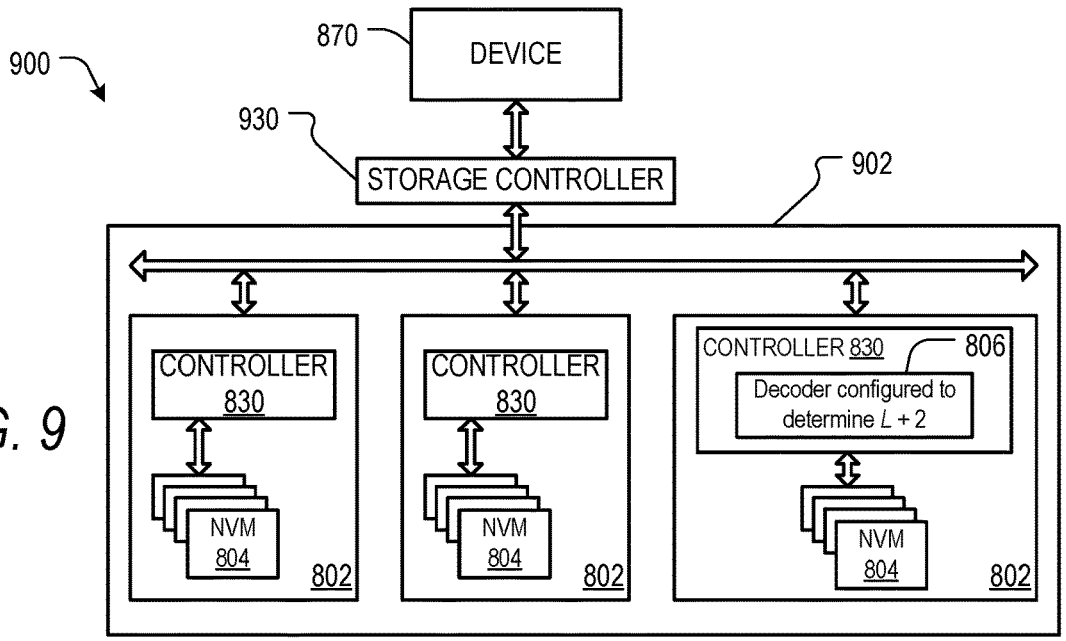
FIG. 9 is a block diagram of a particular illustrative embodiment of a storage system including a plurality of the non-volatile memory systems of FIG. 8.

FIG. 9 illustrates a storage system 900 that includes multiple non-volatile memory systems 802. As such, storage system 900 may include a storage controller 930 that interfaces with the device 870 (e.g., a host device) and with a storage system 902, which includes a plurality of non-volatile memory systems 802. The interface between the storage controller 930 and the non-volatile memory systems 802 may be a bus interface, such as a serial advanced technology attachment (SATA) or peripheral component interface express (PCIe) interface. The storage system 900 may correspond to a solid state drive (SSD), such as found in portable computing devices, such as laptop computers, and tablet computers. One or more of the controllers 830 of FIG. 8 may include the decoder 806. Alternatively or in addition, storage controller 930 may include the decoder 806.

Figure 10:
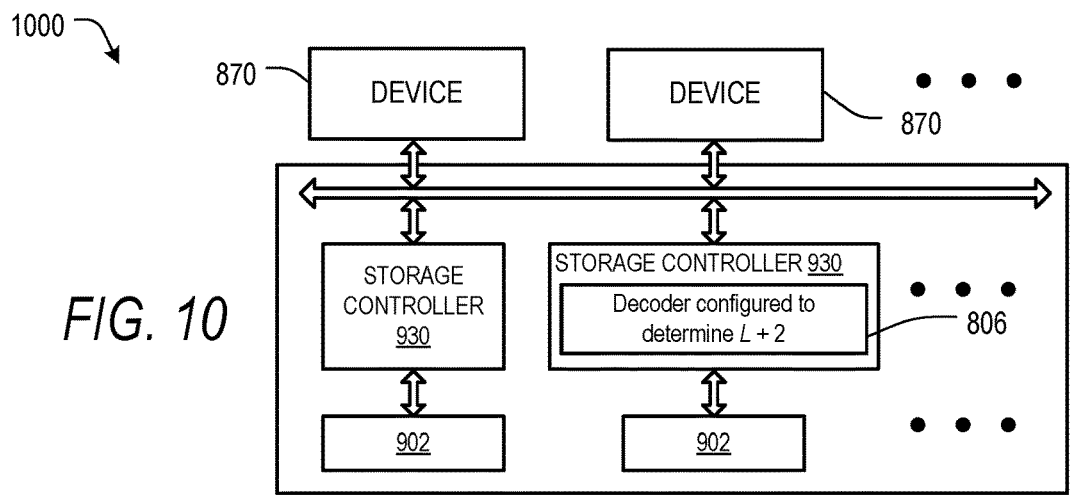
FIG. 10 is a block diagram of a particular illustrative embodiment of a hierarchical storage system that includes a plurality of the storage systems of FIG. 9.

FIG. 10 is a block diagram illustrating a hierarchical storage system 1000. The hierarchical storage system 1000 includes a plurality of storage controllers 930, each of which controls a respective storage system 902. Devices 870 (e.g., one or more host devices or accessing devices) may access memories within the hierarchical storage system 1000 via a bus interface. In one embodiment, the bus interface may be an NVMe or fiber channel over Ethernet (FCoE) interface. In one embodiment, the hierarchical storage system 1000 illustrated in FIG. 10 may be a rack mountable mass storage system that is accessible by multiple host computers, such as would be found in a data center or other location where mass storage is needed. One or more storage controllers 930 of FIG. 10 may include the decoder 806.

Figure 11:
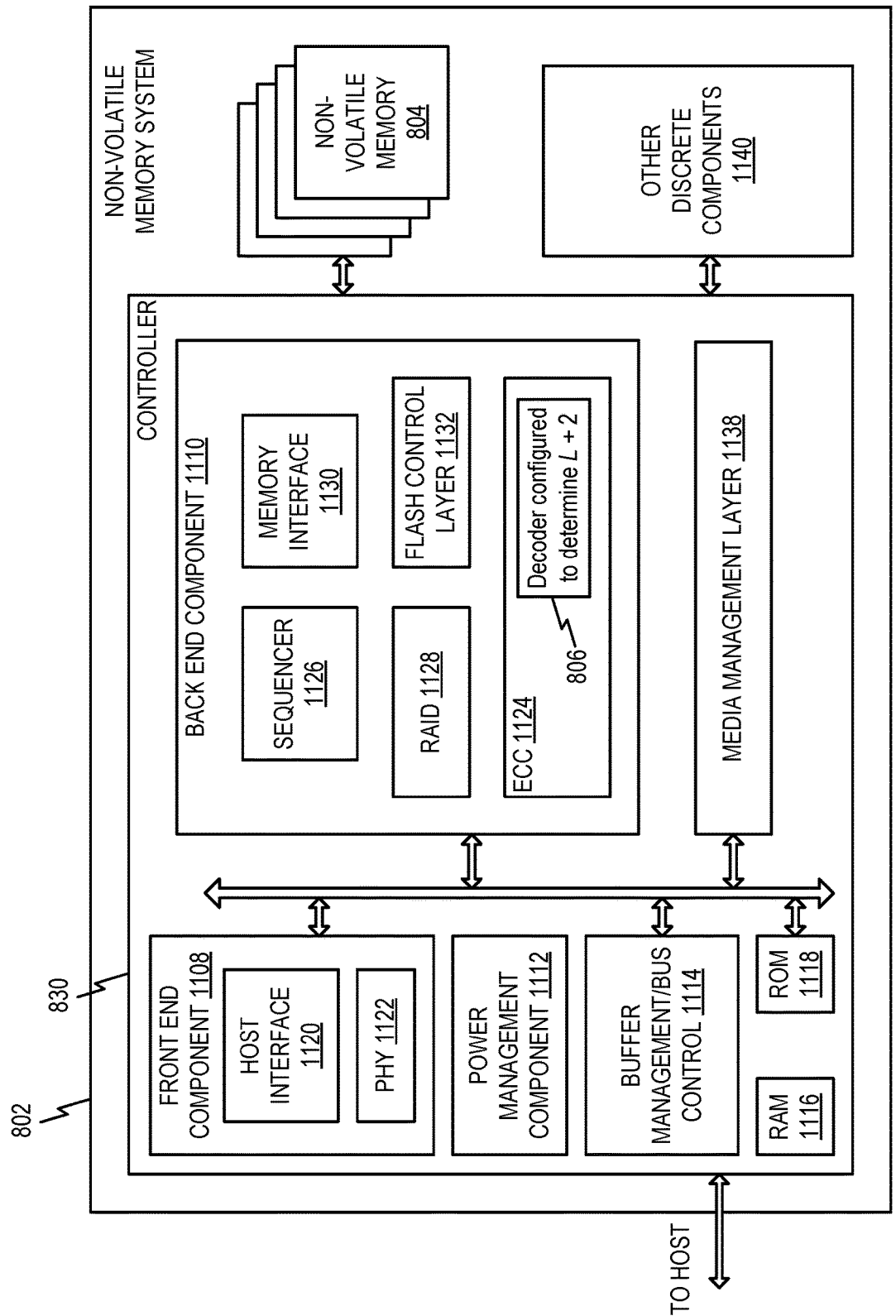
FIG. 11 is a block diagram of a memory system and depicts components of a particular illustrative embodiment of a controller of the non-volatile memory system of FIG. 8.

FIG. 11 is a block diagram illustrating exemplary components of the controller 830 of the non-volatile memory system 802 in more detail. The controller 830 may include the decoder 806. The controller 830 also includes a front end component 1108 that interfaces with a host device, a back end component 1110 that interfaces with the one or more non-volatile memory dies 804, and various other modules that perform other functions. A module may take the form of a packaged functional hardware unit designed for use with other components, a portion of a program code (e.g., software or firmware) executable by a (micro)processor or processing circuitry that usually performs a particular function of related functions, or a self-contained hardware or software component that interfaces with a larger system, for example.

Referring again to the controller 830, a buffer manager/bus controller 1114 manages buffers in random access memory (RAM) 1116 and controls the internal bus arbitration of the controller 830. A read only memory (ROM) 1118 stores system boot code. Although illustrated in FIG. 11 as located within the controller 830, in other embodiments one or both of the RAM 1116 and the ROM 1118 may be located externally to the controller 830. In yet other embodiments, portions of RAM and ROM may be located both within the controller 830 and outside the controller 830.

Front end component 1108 includes a host interface 1120 and a physical layer interface (PHY) 1122 that provide the electrical interface with the host device or next level storage controller. The choice of the type of host interface 1120 can depend on the type of memory being used. Examples of host interfaces 1120 include, but are not limited to, SATA, SATA Express, SAS, Fibre Channel, USB, PCIe, and NVMe. The host interface 1120 typically facilitates transfer for data, control signals, and timing signals.

Back end component 1110 includes an error correcting code (ECC) engine 1124 that encodes the data received from the host device, and decodes and error corrects the data read from the non-volatile memory. A command sequencer 1126 generates command sequences, such as program and erase command sequences, to be transmitted to the one or more non-volatile memory dies 804. A RAID (Redundant Array of Independent Drives) component 1128 manages generation of RAID parity and recovery of failed data. The RAID parity may be used as an additional level of integrity protection for the data being written into the one or more non-volatile memory dies 804. In some cases, the RAID component 1128 may be a part of the ECC engine 1124. A memory interface 1130 provides the command sequences to non-volatile memory die 804 and receives status information from the one or more non-volatile memory dies 804. For example, the memory interface 1130 may be a double data rate (DDR) interface, such as a Toggle Mode 200, 400, or 800 interface. A flash control layer 1132 controls the overall operation of back end component 1110.

Additional components of the non-volatile memory system 802 illustrated in FIG. 11 include a power management component 1112 and a media management layer 1138, which performs wear leveling of memory cells of the one or more non-volatile memory dies 804. Non-volatile memory system 802 also includes other discrete components 1140, such as external electrical interfaces, external RAM, resistors, capacitors, or other components that may interface with the controller 830. In alternative embodiments, one or more of the physical layer interface 1122, RAID component 1128, media management layer 1138 and buffer management/bus controller 1114 are optional components that are omitted from the controller 830.

Figure 12:
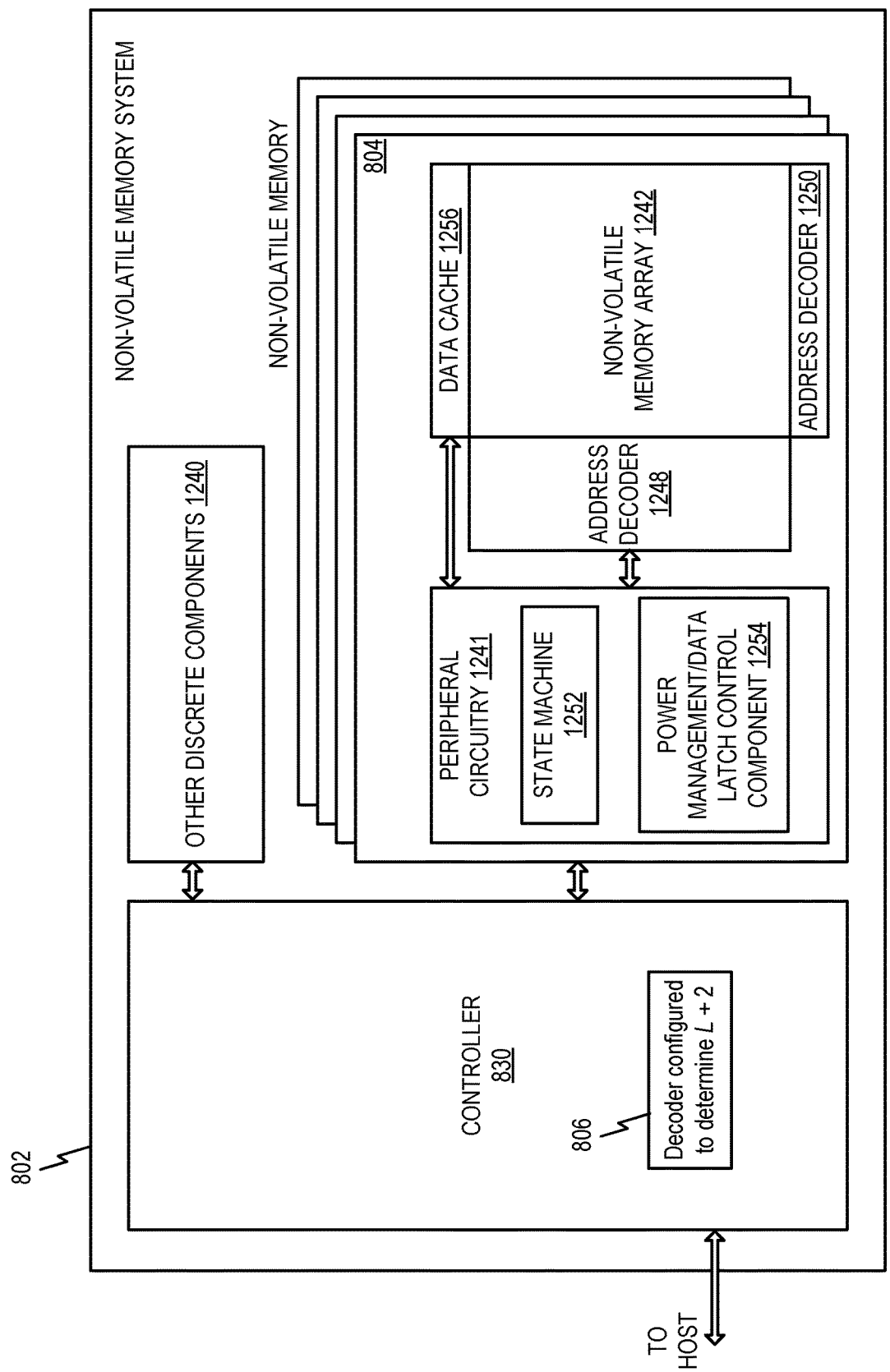
FIG. 12 is a block diagram of a memory system and depicts components of a particular illustrative embodiment of a non-volatile memory die of the non-volatile memory system of FIG. 8.

FIG. 12 is a block diagram illustrating exemplary components of the one or more non-volatile memory dies 804 of the non-volatile memory system 802 in more detail. The one or more non-volatile memory dies 804 include peripheral circuitry 1241 and a non-volatile memory array 1242. The non-volatile memory array 1242 includes the non-volatile memory cells used to store data. The non-volatile memory cells may be any suitable non-volatile memory cells, including NAND flash memory cells and/or NOR flash memory cells in a two dimensional and/or three dimensional configuration. The peripheral circuitry 1241 includes a state machine 1252 that provides status information to the controller 830. The peripheral circuitry 1241 may also include a power management or data latch control component 1254. The one or more non-volatile memory dies 804 further include discrete components 1240, an address decoder 1248, an address decoder 1250, and a data cache 1256 that caches data. FIG. 12 also illustrates that the controller 830 may include the decoder 806.

In conjunction with the described embodiments, an apparatus includes means for receiving a clock signal (e.g., the clock signal 202) and first data (e.g., the first data 134) and for generating an error locator polynomial (e.g., the error locator polynomial 152) based on the first data using a first number of clock cycles (e.g., j clock cycles) of the clock signal. For example, the means for receiving may include the error locator polynomial generator circuit 208, the decoder 350, the first circuit 352, the second circuit 354, another circuit or processor configured to operate according to Example 1 or the set of operations 400 of FIG. 4, or any combination thereof. The first number is less than a number of errors (e.g., k errors) of the first data. The apparatus further includes means (e.g., the error corrector circuit 210) for generating second data (e.g., the second data 136) by adjusting the first data based on the error locator polynomial. The apparatus may further include means (e.g., the syndrome generator circuit 204) for providing an indication of syndromes (e.g., the syndrome polynomial 206) associated with the first data to the means for generating the second data.

Although various components depicted herein are illustrated as block components and described in general terms, such components may include one or more microprocessors, state machines, or other circuits configured to enable such components to perform one or more operations described herein. For example, one or both of the decoder 150 and the decoder 350 may represent physical components, such as hardware controllers, state machines, logic circuits, or other structures, to enable the controller 130 and the controller 330 to perform one or more operations described herein.

Alternatively or in addition, one or both of the decoder 150 and the decoder 350 may be implemented using a microprocessor or microcontroller programmed to perform decoding operations. In a particular embodiment, one or both of the decoder 150 and the decoder 350 include a processor executing instructions (e.g., firmware) that are stored at the memory 104. Alternatively, or in addition, executable instructions that are executed by the processor may be stored at a separate memory location that is not part of the memory 104, such as at a read-only memory (ROM).

It should be appreciated that one or more operations described herein as being performed by the controller 130 and the controller 330 may be performed at the memory device 103. As an illustrative example, one or more decoding operations described with reference to the decoder 150 and the decoder 350 may be performed at the memory device 103.

The data storage devices 102, 302 may be coupled to, attached to, or embedded within one or more accessing devices, such as within a housing of the device 170. For example, the data storage devices 102, 302 may be embedded within the device 170 in accordance with a Joint Electron Devices Engineering Council (JEDEC) Solid State Technology Association Universal Flash Storage (UFS) configuration. To further illustrate, the data storage devices 102, 302 may be integrated within an electronic device (e.g., the device 170), such as a mobile telephone, a computer (e.g., a laptop, a tablet, or a notebook computer), a music player, a video player, a gaming device or console, an electronic book reader, a personal digital assistant (PDA), a portable navigation device, or other device that uses internal non-volatile memory.

In one or more other implementations, the data storage devices 102, 302 may be implemented in a portable device configured to be selectively coupled to one or more external devices, such as a host device. For example, the data storage devices 102, 302 may be removable from the device 170 (i.e., "removably" coupled to the device 170). As an example, the data storage devices 102, 302 may be removably coupled to the device 170 in accordance with a removable universal serial bus (USB) configuration.

The device 170 may correspond to a mobile telephone, a computer (e.g., a laptop, a tablet, or a notebook computer), a music player, a video player, a gaming device or console, an electronic book reader, a personal digital assistant (PDA), a portable navigation device, another electronic device, or a combination thereof. The device 170 may communicate via a controller, which may enable the device 170 to communicate with the data storage devices 102, 302. The device 170 may operate in compliance with a JEDEC Solid State Technology Association industry specification, such as an embedded MultiMedia Card (eMMC) specification or a Universal Flash Storage (UFS) Host Controller Interface specification. The device 170 may operate in compliance with one or more other specifications, such as a Secure Digital (SD) Host Controller specification as an illustrative example. Alternatively, the device 170 may communicate with the data storage devices 102, 302 in accordance with another communication protocol. In some implementations, the data storage devices 102, 302 may be integrated within a network-accessible data storage system, such as an enterprise data system, an NAS system, or a cloud data storage system, as illustrative examples.

In some implementations, one or both of the data storage devices 102, 302 may include a solid state drive (SSD). One or both of the data storage devices 102, 302 may function as an embedded storage drive (e.g., an embedded SSD drive of a mobile device), an enterprise storage drive (ESD), a cloud storage device, a network-attached storage (NAS) device, or a client storage device, as illustrative, non-limiting examples. In some implementations, one or both of the data storage devices 102, 302 may be coupled to the device 170 via a network. For example, the network may include a data center storage system network, an enterprise storage system network, a storage area network, a cloud storage network, a local area network (LAN), a wide area network (WAN), the Internet, and/or another network.

To further illustrate, one or both of the data storage devices 102, 302 may be configured to be coupled to the device 170 as embedded memory, such as in connection with an embedded MultiMedia Card (eMMC®) (trademark of JEDEC Solid State Technology Association, Arlington, Va.) configuration, as an illustrative example. One or both of the data storage devices 102, 302 may correspond to an eMMC device. As another example, one or both of the data storage devices 102, 302 may correspond to a memory card, such as a Secure Digital (SD®) card, a microSD® card, a miniSD™ card (trademarks of SD-3C LLC, Wilmington, Del.), a MultiMediaCard™ (MMC™) card (trademark of JEDEC Solid State Technology Association, Arlington, Va.), or a CompactFlash® (CF) card (trademark of SanDisk Corporation, Milpitas, Calif.). One or both of the data storage devices 102, 302 may operate in compliance with a JEDEC industry specification. For example, the data storage devices 102, 302 may operate in compliance with a JEDEC eMMC specification, a JEDEC Universal Flash Storage (UFS) specification, one or more other specifications, or a combination thereof.

The memory 104 may include a resistive random access memory (ReRAM), a flash memory (e.g., a NAND memory, a NOR memory, a single-level cell (SLC) flash memory, a multi-level cell (MLC) flash memory, a divided bit-line NOR (DINOR) memory, an AND memory, a high capacitive coupling ratio (HiCR) device, an asymmetrical contactless transistor (ACT) device, or another flash memory), an erasable programmable read-only memory (EPROM), an electrically-erasable programmable read-only memory (EEPROM), a read-only memory (ROM), a one-time programmable memory (OTP), another type of memory, or a combination thereof. The memory 104 may include a semiconductor memory device.

Semiconductor memory devices include volatile memory devices, such as dynamic random access memory ("DRAM") or static random access memory ("SRAM") devices, non-volatile memory devices, such as resistive random access memory ("ReRAM"), magnetoresistive random access memory ("MRAM"), electrically erasable programmable read only memory ("EEPROM"), flash memory (which can also be considered a subset of EEPROM), ferroelectric random access memory ("FRAM"), and other semiconductor elements capable of storing information. Each type of memory device may have different configurations. For example, flash memory devices may be configured in a NAND or a NOR configuration.

The memory devices can be formed from passive and/or active elements, in any combinations. By way of non-limiting example, passive semiconductor memory elements include ReRAM device elements, which in some embodiments include a resistivity switching storage element, such as an anti-fuse, phase change material, etc., and optionally a steering element, such as a diode, etc. Further by way of non-limiting example, active semiconductor memory elements include EEPROM and flash memory device elements, which in some embodiments include elements containing a charge region, such as a floating gate, conductive nanoparticles, or a charge storage dielectric material.

Multiple memory elements may be configured so that they are connected in series or so that each element is individually accessible. By way of non-limiting example, flash memory devices in a NAND configuration (NAND memory) typically contain memory elements connected in series. A NAND memory array may be configured so that the array is composed of multiple strings of memory in which a string is composed of multiple memory elements sharing a single bit line and accessed as a group. Alternatively, memory elements may be configured so that each element is individually accessible, e.g., a NOR memory array. NAND and NOR memory configurations are exemplary, and memory elements may be otherwise configured.

The semiconductor memory elements located within and/or over a substrate may be arranged in two or three dimensions, such as a two dimensional memory structure or a three dimensional memory structure. In a two dimensional memory structure, the semiconductor memory elements are arranged in a single plane or a single memory device level. Typically, in a two dimensional memory structure, memory elements are arranged in a plane (e.g., in an x-z direction plane) which extends substantially parallel to a major surface of a substrate that supports the memory elements. The substrate may be a wafer over or in which the layer of the memory elements are formed or it may be a carrier substrate which is attached to the memory elements after they are formed. As a non-limiting example, the substrate may include a semiconductor such as silicon.

The memory elements may be arranged in the single memory device level in an ordered array, such as in a plurality of rows and/or columns. However, the memory elements may be arrayed in non-regular or non-orthogonal configurations. The memory elements may each have two or more electrodes or contact lines, such as bit lines and word lines.

A three dimensional memory array is arranged so that memory elements occupy multiple planes or multiple memory device levels, thereby forming a structure in three dimensions (i.e., in the x, y and z directions, where they direction is substantially perpendicular and the x and z directions are substantially parallel to the major surface of the substrate). As a non-limiting example, a three dimensional memory structure may be vertically arranged as a stack of multiple two dimensional memory device levels. As another non-limiting example, a three dimensional memory array may be arranged as multiple vertical columns (e.g., columns extending substantially perpendicular to the major surface of the substrate, i.e., in they direction) with each column having multiple memory elements in each column.

The columns may be arranged in a two dimensional configuration, e.g., in an x-z plane, resulting in a three dimensional arrangement of memory elements with elements on multiple vertically stacked memory planes. Other configurations of memory elements in three dimensions can also constitute a three dimensional memory array.

By way of non-limiting example, in a three dimensional NAND memory array, the memory elements may be coupled together to form a NAND string within a single horizontal (e.g., x-z) memory device levels. Alternatively, the memory elements may be coupled together to form a vertical NAND string that traverses across multiple horizontal memory device levels. Other three dimensional configurations can be envisioned wherein some NAND strings contain memory elements in a single memory level while other strings contain memory elements which span through multiple memory levels. Three dimensional memory arrays may also be designed in a NOR configuration and in a ReRAM configuration.

Typically, in a monolithic three dimensional memory array, one or more memory device levels are formed above a single substrate. Optionally, the monolithic three dimensional memory array may also have one or more memory layers at least partially within the single substrate. As a non-limiting example, the substrate may include a semiconductor such as silicon. In a monolithic three dimensional array, the layers constituting each memory device level of the array are typically formed on the layers of the underlying memory device levels of the array. However, layers of adjacent memory device levels of a monolithic three dimensional memory array may be shared or have intervening layers between memory device levels.

Alternatively, two dimensional arrays may be formed separately and then packaged together to form a non-monolithic memory device having multiple layers of memory. For example, non-monolithic stacked memories can be constructed by forming memory levels on separate substrates and then stacking the memory levels atop each other. The substrates may be thinned or removed from the memory device levels before stacking, but as the memory device levels are initially formed over separate substrates, the resulting memory arrays are not monolithic three dimensional memory arrays. Further, multiple two dimensional memory arrays or three dimensional memory arrays (monolithic or non-monolithic) may be formed on separate chips and then packaged together to form a stacked-chip memory device.

Associated circuitry is typically required for operation of the memory elements and for communication with the memory elements. As non-limiting examples, memory devices may have circuitry used for controlling and driving memory elements to accomplish functions such as programming and reading. This associated circuitry may be on the same substrate as the memory elements and/or on a separate substrate. For example, a controller for memory read-write operations may be located on a separate controller chip and/or on the same substrate as the memory elements.

One of skill in the art will recognize that this disclosure is not limited to the two dimensional and three dimensional exemplary structures described but cover all relevant memory structures within the spirit and scope of the disclosure as described herein and as understood by one of skill in the art. The illustrations of the embodiments described herein are intended to provide a general understanding of the various embodiments. Other embodiments may be utilized and derived from the disclosure, such that structural and logical substitutions and changes may be made without departing from the scope of the disclosure. This disclosure is intended to cover any and all subsequent adaptations or variations of various embodiments. Those of skill in the art will recognize that such modifications are within the scope of the present disclosure.

The above-disclosed subject matter is to be considered illustrative, and not restrictive, and the appended claims are intended to cover all such modifications, enhancements, and other embodiments, that fall within the scope of the present disclosure. Thus, to the maximum extent allowed by law, the scope of the present invention is to be determined by the broadest permissible interpretation of the following claims and their equivalents, and shall not be restricted or limited by the foregoing detailed description.

What is claimed is:

1. A method of operation of a decoder, the method comprising:
   receiving, with the decoder, an error parity of a first data;
   receiving, with the decoder, the first data; and
   generating, with the decoder, second data by adjusting a length of an error locator polynomial based on the error parity of the first data,
   wherein the adjusting the length of the error locator polynomial reduces at least one of decoding latency or power consumption of the decoder.

2. The method of claim 1, wherein the adjusting the length of the error locator polynomial includes increasing the length of the error locator polynomial by a value of two.

3. The method of claim 2, wherein the length of the error locator polynomial is increased in a single iteration of a decoding process to decode the first data.

4. The method of claim 1, further comprising;
   generating a syndrome polynomial based on the first data; and
   adjusting coefficients of the error locator polynomial based on the syndrome polynomial.

5. The method of claim 1, further comprising identifying a number of logic one values included in the first data, wherein the error parity corresponds to a difference between the number of logic one values and a codeword parity that is associated with each codeword of an encoding scheme used to encode the first data.

6. The method of claim 5, further comprising setting the error parity to a logic zero value in response to determining that the number of logic one values included in the first data is even.

7. The method of claim 5, wherein the adjusting the length of the error locator polynomial includes increasing the length of the error locator polynomial by a value of two if the error parity is equal to a parity of the error locator polynomial.

8. The method of claim 5, further comprising setting the error parity to a logic one value in response to determining that the number of logic one values included in the first data is odd.

9. The method of claim 5, wherein the adjusting the length of the error locator polynomial includes increasing the length of the error locator polynomial by a value of one if the error parity is not equal to a parity of the error locator polynomial.

10. The method of claim 1, further comprising:
    generating a syndrome polynomial based on the first data;
    determining that the error locator polynomial is correct based on a product of the error locator polynomial and the syndrome polynomial;
    determining one or more error locations of the first data based on the error locator polynomial; and adjusting values of the first data based on the one or more error locations.

11. The method of claim 10, wherein the determining of the one or more error locations includes determining a set of roots of the error locator polynomial.

12. The method of claim 1, wherein the first data is encoded in accordance with a Bose-Chaudhuri-Hocquenghem (BCH) code.

13. The method of claim 12, wherein each codeword included in a codebook of the BCH code including an even number of logic one values.

14. The method of claim 1, wherein generating the second data includes decoding the first data in accordance with an improved Berlekamp-Massey (BM) technique that is capable of performing two iterations of a decoding process in parallel.

15. The method of claim 1, wherein generating the second data includes decoding the first data in accordance with an improved Peterson-Gorenstein-Zierler (PGZ) technique that is capable of performing two iterations of a decoding process in parallel.

16. An apparatus comprising:
a circuit configured to determine an error parity of first data; and
a decoder coupled to the circuit, the decoder configured to generate second data by adjusting a length of an error locator polynomial of the decoder based on the error parity of the first data,
wherein the adjusting the length of the error locator polynomial reduces at least one of decoding latency or power consumption of the decoder.

17. The apparatus of claim 16, further comprising an encoder configured to generate a set of codewords, each having an even number of logic one values.

18. The apparatus of claim 17, wherein the encoder is further configured to encode the first data using a generator polynomial having a factor selected to cause each codeword of the set of codewords to have the even number of logic one values.

19. The apparatus of claim 16, wherein the circuit is further configured to determine the error parity based on whether the first data indicates an even number of logic one values or an odd number of logic one values.

20. The apparatus of claim 16, wherein the decoder is further configured to receive an indication of the error parity from the circuit.

21. The apparatus of claim 16, further comprising:
a controller that includes the circuit and the decoder; and
a memory coupled to the controller.

22. An apparatus comprising:
a first circuit configured to receive first data and to perform a set of decoding operations based on the first data by adjusting a length of a first error locator polynomial based on an even error parity of the first data;
a second circuit configured to receive the first data and to perform the set of decoding operations by adjusting a length of a second error locator polynomial based on an odd error parity of the first data; and
a third circuit coupled to the first circuit and to the second circuit, the third circuit configured to select an output of the first circuit or the second circuit to provide a second data,
wherein adjusting the length of the first error locator polynomial reduces at least one of decoding latency or power consumption of the first circuit, and
wherein adjusting the length of the second error locator polynomial reduces at least one of decoding latency or power consumption of the second circuit.

23. The apparatus of claim 22, wherein the first circuit and the second circuit are configured to perform two iterations of a Berlekamp-Massey (BM) decoding process in parallel.

24. The apparatus of claim 22, wherein the first data includes a set of symbols encoded in accordance with a Reed-Solomon (RS) code or a Bose-Chaudhuri-Hocquenghem (BCH) code.

25. The apparatus of claim 24, wherein the third circuit is further configured to select the output of the first circuit or the second circuit in response to detecting that the output satisfies convergence criteria associated with the RS code.

26. The apparatus of claim 22, wherein the set of decoding operations is performed in accordance with a Berlekamp-Massey (BM) technique.

* * * * *